(12) United States Patent
Kusnadi et al.

(10) Patent No.: US 7,805,699 B2
(45) Date of Patent: Sep. 28, 2010

(54) SHAPE-BASED PHOTOLITHOGRAPHIC MODEL CALIBRATION

(75) Inventors: Ir Kusnadi, San Jose, CA (US); Yuri Granik, Palo Alto, CA (US)

(73) Assignee: Mentor Graphics Corporation

( * ) Notice: Subject to any disclaimer, the term of this patent is extended or adjusted under 35 U.S.C. 154(b) by 384 days.

(21) Appl. No.: 11/974,499

(22) Filed: Oct. 11, 2007

(65) Prior Publication Data

US 2009/0100389 A1    Apr. 16, 2009

(51) Int. Cl.
    G06F 17/50    (2006.01)
(52) U.S. Cl. ............................ 716/19; 716/20; 716/21
(58) Field of Classification Search ............. 716/19–21
    See application file for complete search history.

(56) References Cited

U.S. PATENT DOCUMENTS

| | | | |
|---|---|---|---|
| 4,532,650 A | 7/1985 | Wihl et al. |
| 4,762,396 A | 8/1988 | Dumant et al. |
| 5,396,584 A | 3/1995 | Lee et al. |
| 5,502,654 A | 3/1996 | Sawahata |
| 5,723,233 A | 3/1998 | Garza et al. |
| 5,815,685 A | 9/1998 | Kamon |
| 5,825,647 A | 10/1998 | Tsudaka |
| 5,879,844 A | 3/1999 | Yamamoto et al. |
| 5,991,006 A | 11/1999 | Tsudaka |
| 6,016,357 A | 1/2000 | Neary et al. |
| 6,033,814 A | 3/2000 | Burdorf et al. |
| 6,042,257 A | 3/2000 | Tsudaka |
| 6,049,660 A | 4/2000 | Ahn et al. |
| 6,077,310 A | 6/2000 | Yamamoto et al. |
| 6,080,527 A | 6/2000 | Huang et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |

(Continued)

FOREIGN PATENT DOCUMENTS

JP    09-319067    12/1997

(Continued)

OTHER PUBLICATIONS

Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).

(Continued)

*Primary Examiner*—Jack Chiang
*Assistant Examiner*—Brandon W Bowers
(74) *Attorney, Agent, or Firm*—Klarquist Sparkman, LLP

(57) ABSTRACT

A method and apparatus for determining how well a photolithographic model simulates a photolithographic printing process. A test pattern of features is printed on a wafer and the shape of the printed features is compared with the shape of simulated features produced by the model. A cost function is calculated from the comparison that quantifies how well the model simulates the photolithographic printing process.

34 Claims, 13 Drawing Sheets

U.S. PATENT DOCUMENTS

| | | | |
|---|---|---|---|
| 6,430,737 | B1 | 8/2002 | Cobb et al. |
| 6,453,457 | B1 | 9/2002 | Pierrat et al. |
| 6,467,076 | B1 | 10/2002 | Cobb |
| 6,470,489 | B1 | 10/2002 | Chang et al. |
| 6,499,003 | B2 | 12/2002 | Jones et al. |
| 6,574,784 | B1 | 6/2003 | Lippincott et al. |
| 6,643,616 | B1 | 11/2003 | Granik et al. |
| 6,649,309 | B2 | 11/2003 | Mukherjee |
| 6,665,856 | B1* | 12/2003 | Pierrat et al. ................. 716/19 |
| 6,668,367 | B2 | 12/2003 | Cobb et al. |
| 6,748,578 | B2 | 6/2004 | Cobb |
| 6,792,590 | B1 | 9/2004 | Pierrat et al. |
| 6,817,003 | B2 | 11/2004 | Lippincott et al. |
| 6,857,109 | B2 | 2/2005 | Lippincott |
| 6,887,633 | B2 | 5/2005 | Tang |
| 6,928,634 | B2 | 8/2005 | Granik et al. |
| 6,973,633 | B2 | 12/2005 | Lippincott et al. |
| 7,010,776 | B2 | 3/2006 | Gallatin et al. |
| 7,013,439 | B2 | 3/2006 | Robles et al. |
| 7,024,655 | B2 | 4/2006 | Cobb |
| 7,028,284 | B2 | 4/2006 | Cobb et al. |
| 7,047,516 | B2 | 5/2006 | Futatsuya |
| 7,073,162 | B2 | 7/2006 | Cobb et al. |
| 7,155,699 | B2 | 12/2006 | Cobb |
| 7,181,721 | B2 | 2/2007 | Lippincott et al. |
| 7,234,130 | B2 | 6/2007 | Word et al. |
| 7,237,221 | B2 | 6/2007 | Granik et al. |
| 7,240,305 | B2 | 7/2007 | Lippincott |
| 7,240,321 | B2 | 7/2007 | Cobb et al. |
| 7,245,354 | B2 | 7/2007 | Granik |
| 7,281,234 | B2 | 10/2007 | Lippincott |
| 7,293,249 | B2 | 11/2007 | Robles et al. |
| 7,324,930 | B2 | 1/2008 | Cobb |
| 7,367,009 | B2 | 4/2008 | Cobb et al. |
| 7,378,202 | B2 | 5/2008 | Granik et al. |
| 7,392,168 | B2 | 6/2008 | Granik et al. |
| 2005/0149901 | A1 | 7/2005 | Tang |
| 2005/0210437 | A1* | 9/2005 | Shi et al. ................. 716/19 |
| 2005/0251771 | A1 | 11/2005 | Robles |
| 2005/0278686 | A1 | 12/2005 | Word et al. |
| 2005/0287450 | A1* | 12/2005 | Hudek et al. ................. 430/30 |
| 2005/0287451 | A1* | 12/2005 | Hudek et al. ................. 430/30 |
| 2006/0188796 | A1 | 8/2006 | Word |
| 2006/0199084 | A1 | 9/2006 | Word |
| 2006/0200790 | A1 | 9/2006 | Shang et al. |
| 2006/0240342 | A1 | 10/2006 | Tang |
| 2007/0031745 | A1* | 2/2007 | Ye et al. ................. 430/30 |
| 2007/0074143 | A1 | 3/2007 | Cobb et al. |
| 2007/0118826 | A1 | 5/2007 | Lippincott |
| 2007/0124708 | A1 | 5/2007 | Robles et al. |
| 2008/0141195 | A1 | 6/2008 | Robles et al. |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 7/2001 |

OTHER PUBLICATIONS

Bailey et al., "Intensive 2D SEM Model Calibration for 45nm and Beyond," Proceedings of SPIE, vol. 6154, 10 pp. (Feb. 21, 2006).

Cobb et al., "Experimental Results on Optical Proximity Correction With Variable Threshold Resist Model," *Proceedings of SPIE: Symposium on Optical Microlithography X*, vol. 3051, pp. 458-468 (Mar. 10-14, 1997).

Cobb et al., "Fast, Low-Complexity Mask Design," *Proceedings of SPIE: Symposium on Optical/Laser Microlithography VIII*, vol. 2440, pp. 313-327 (Feb. 22-24, 1995).

Cobb et al., "Fast Sparse Aerial Image Calculation for OPC," *Proceedings of SPIE: 15th Annual BACUS Symposium on Photomask Technology and Management*, vol. 2621, pp. 534-545 (Sep. 20-22, 1995).

Cobb, "Flexible Sparse and Dense OPC Algorithms," *Proceedings of SPIE, Photomask and Next-Generation Lithography Mask Technology XII*, vol. 5853, pp. 693-702 (Apr. 13, 2005).

Cobb et al., "Large Area Phase-Shift Mask Design," *Proceedings of SPIE, Symposium on Optical/Laser Microlithography VII*, vol. 2197, pp. 348-360 (Mar. 2-4, 1994).

Cobb et al., "Mathematical and CAD Framework for Proximity Correction," *Proceedings of SPIE: Symposium on Optical Microlithography IX*, vol. 2726, pp. 208-222 (Mar. 13-15, 1996).

Cobb et al., "Model-Based OPC Using the MEEF Matrix," *Proceedings of SPIE, 22nd Annual BACUS Symposium on Photomask Technology*, vol. 4889, 10 pp. (Sep. 30-Oct. 4, 2002).

Cobb et al., "New Concepts in OPC," *Proceedings of SPIE: Optical Microlithography XVII*, vol. 5377, pp. 680-690 (Feb. 24, 2004).

Cobb et al., "OPC Methods to Improve Image Slope and Process Window," *Proceedings of SPIE: Design and Process Integration for Microelectronic Manufacturing*, vol. 5042, pp. 116-125 (Feb. 27, 2003).

Cobb et al., "Using OPC to Optimize for Image Slope and Improve Process Window," *Proceeding of SPIE, Photomask Japan*, vol. 5130, pp. 838-846 (Apr. 16-18, 2003).

Granik, "Calibration of Compact OPC Models Using SEM Contours," *Proceedings of SPIE: 25th Annual BACUS Symposium on Photomask Technology*, vol. 5992, pp. 59921V-1 through 59921V-7 (Oct. 3, 2005).

Granik et al., "Challenges of OPC Model Calibration from SEM Contours," *Proc. SPIE*, vol. 6922, pp. 69221H-1 through 69221H-8 (Feb. 2008).

Granik, "Generalized MEEF Theory," *Interface 2001*, 13 pp. (Nov. 2001).

Granik et al., "MEEF as a Matrix," *Proceedings of SPIE: 21st Annual BACUS Symposium on Photomask Technology*, vol. 4562, pp. 980-991 (Oct. 2-5, 2001).

Granik, "New Process Models for OPC at sub-90nm Nodes," *Proceedings of SPIE: Optical Microlithography XVI*, vol. 5040, pp. 1166-1175 (Feb. 25, 2003).

Granik, "Solving Inverse Problems of Optical Microlithography," *Proceedings of SPIE: Optical Microlithography XVIII*, vol. 5754, pp. 506-526 (Mar. 1, 2005).

Granik et al., "Two-Dimensional G-MEEF Theory and Applications," *Proceedings of SPIE: Symposium on Photomask and Next-Generation Lithography Mask Technology IX*, vol. 4754, pp. 146-155 (Apr. 23-25, 2002).

Granik et al., "Universal process modeling with VTRE for OPC," *Proceedings of SPIE: Optical Microlithography XV*, vol. 4691, pp. 377-394 (Mar. 5, 2002).

Haidinyak et al., "Applications Using 2D Contact CDSEM Images," *Proceedings of SPIE: 24th Annual BACUS Symposium on Photomask Technology*, vol. 5567, pp. 732-740 (Sep. 14, 2004).

Maurer et al., "Evaluation of a Fast and Flexible OPC Package: Optissimo," *Proceedings of SPIE: 16th Annual Symposium on Photomask Technology and Management*, vol. 2884, pp. 412-418 (Sep. 18-20, 1996).

Maurer et al., "Process Proximity Correction Using an Automated Software Tool," *Proceedings of SPIE: Optical Microlithography XI*, vol. 3334, pp. 245-253 (Feb. 22-27, 1998).

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Mentor Graphics Corporation, News and Views, "Calibre," including a partial translation, 9 pp. (document marked Apr. 2000).

Ohnuma et al., "Lithography Computer Aided Design Technology for Embedded Memory in Logic," *Japanese Journal of Applied Physics*, vol. 37(12B), pp. 6686-6688 (Dec. 1998).

Patterson et al., "Circuit-Based SEM Contour OPC Model Calibration," *Proceedings of SPIE: Design for Manufacturability through Design-Process Integration*, vol. 6521, pp. 65211N-1 through 65211N-8 (Feb. 28, 2007).

Schellenberg, "Sub-Wavelength Lithography Using OPC," *Semiconductor Fabtech*, 9th ed., pp. 205-209 (Mar. 1999).

Tabery et al., "SEM Image Contouring for OPC Model Calibration and Verification," *Proceedings of SPIE: Optical Microlithography*, vol. 6520, pp. 652019-1 through 652019-11 (Feb. 27, 2007).

Tawfic et al., "Feedback Flow to Improve Model-Based OPC Calibration Test Pattern," *Proceedings of SPIE: Design for Manufacturability through Design-Process Integration*, vol. 6521, pp. 65211J-1 through 65211J-9 (Feb. 28, 2007).

Vasek et al., "SEM-Contour Based Mask Modeling," *Proc. SPIE*, vol. 6924, pp. 69244Q-1 through 69244Q-11 (2008).

Vasek et al., "SEM-Contour-based OPC Model Calibration through the Process Window," *Proceedings of SPIE: Metrology, Inspection, and Process Control for Microlithography XXI*, pp. 65180D-1 through 65180D-10 (Feb. 26, 2007).

Word et al. "Advanced Layout Fragmentation and Simulation Schemes for Model Based OPC," *Proceedings of SPIE: Optical Microlithography XVIII*, vol. 5754, pp. 1159-1168 (Mar. 1, 2005).

\* cited by examiner

SHAPE-BASED PHOTOLITHOGRAPHIC MODEL CALIBRATION

FIELD

The disclosed technology relates to photolithographic processing and in particular to model calibration for use in photolithographic simulations.

BACKGROUND

In most integrated circuit design processes, a circuit designer uses a computer program to develop a logical description of the various components that are to be in a new circuit. Other computer programs then take the logical description and convert it into a description of the individual circuit building blocks that will perform the desired circuit functions. Additional computer programs are then used to convert the description of the building blocks into a layout file that specifies the shapes of the various mask or reticle features that are used to expose a wafer during a photolithographic process in order to form the different layers of the integrated circuit.

As the size of the layout features become smaller than the wavelength of light used to expose the mask or reticle, optical and other process distortions can occur such that the pattern of features that is actually created on a wafer does not match the desired layout pattern. To correct for these distortions, various resolution enhancement techniques (RETs) such as optical and process correction (OPC), sub-resolution assist features (SRAFs), phase shifters etc. can be used to improve the fidelity with which a pattern of features is printed in a wafer.

To use a resolution enhancement technique, a simulation is performed that predicts how the features on a mask or reticle will print on a wafer under defined process conditions. From the results of the simulation, the various RETs are employed to compensate for the expected distortions. As will be appreciated, the ability of a resolution enhancement technique to improve the printing fidelity is closely tied to how well the photolithographic model predicts how the features will print on the wafer. The technology disclosed herein relates to quantifying how well a photolithographic model can simulate a photolithographic printing process.

SUMMARY

As will be explained in further detail below, the technology disclosed herein relates to a technique for estimating how well a photolithographic model simulates a photolithographic printing process. In one embodiment, a test pattern is printed on a wafer and the shapes of the features printed on a wafer are compared the shapes of the features that are simulated by the model. Based on the comparison, the ability of the model to simulate a photolithographic process is determined.

In one embodiment, the shapes of the printed features and the shapes of the simulated features are compared by determining a minimum distance between points on a printed feature and a closest edge segment of a simulated feature. The distance between each edge segment of the simulated features and a closest point on a printed feature are also determined. A cost function such as the sum of the shortest distances is calculated to provide an indication of the ability of the photolithographic model to simulate the photolithographic printing process.

BRIEF DESCRIPTION OF THE DRAWINGS

The foregoing and other objects, features, and advantages of the invention will become more apparent from the following detailed description, which proceeds with reference to the accompanying figures, wherein.

DETAILED DESCRIPTION

As described above, in order for a resolution enhancement technique improve the results of a photolithographic printing process, a simulation is performed with a photolithographic model to determine how features on a mask or reticle will print on a semiconductor wafer. To perform the simulation, the model assumes a number of printing conditions such as the wavelength of illumination light, the numerical aperture of the printing system, the chemical properties of the resist materials used on the wafer etc. that are used in the photolithographic process. The results of the simulation can then be compared to a desired target pattern to determine if the results are within acceptable tolerances so that the circuit will function as desired. If the simulation indicates that the features that will be printed on a wafer are not within acceptable tolerances, one or more resolution enhancement techniques can be applied to increase the fidelity of the printed features. As will be appreciated, if the photolithographic model does not accurately predict how features will be printed on the wafer, it is unlikely that the resolution enhancement techniques will be correctly applied to improve printing fidelity.

For purposes of illustration, the techniques disclosed here are described with respect to creating integrated circuits on a wafer. However, it will be appreciated that the disclosed techniques can be used to determine if models used to predict the printing of other devices such as micro-electromechanical machines, recording heads or other devices produced with photolithography are accurate. In addition, although the printing techniques are described with respect to exposing a mask having a pattern of features onto a wafer, it will be appreciated that the wafer can be exposed with features contained on a reticle. Therefore for purposes of the present disclosure, the terms reticle and mask are considered synonymous.

Figure 1:
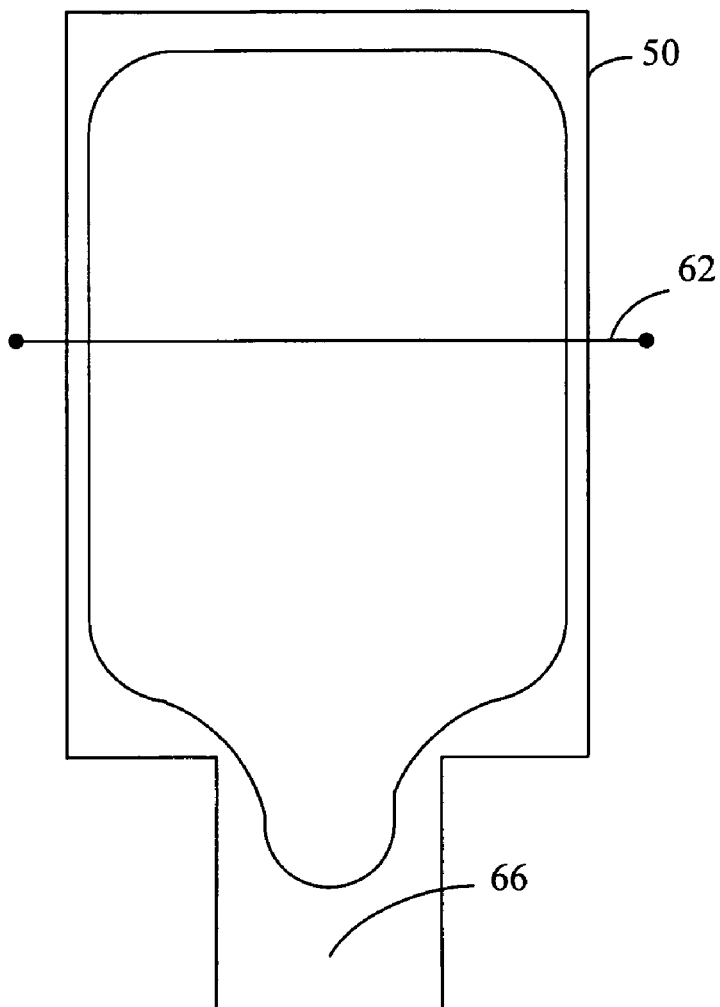
FIG. 1 illustrates a conventional technique for determining if a photolithographic model accurately simulates a photolithographic process.

FIG. 1 illustrates a conventional technique to determine if a photolithographic model accurately simulates a photolithographic printing process. In the example shown, a photolithographic model produces a simulated feature 50 that should print on a wafer under defined process conditions. A test pattern of features (not shown) is printed on a wafer and a corresponding printed feature 60 is then measured along one or more one-dimensional cut-lines 62 using test equipment such as a scanning electron microscope (SEM). The measurements taken along the one dimensional cut-lines are compared with the dimensions of the simulated features to determine if the model is well calibrated to the actual printing process.

In the example shown in FIG. 1, it can be seen that the dimensions of the printed feature 60 are nearly equal to the dimensions of the simulated feature 50 in the area of the cut line 62. Therefore, if the analysis is limited to the measurement along the cut-line 62, it would appear that the model that produces the simulated feature 50 is well calibrated. However, it can also be seen that the model that produces the simulated feature 50 also indicates that the simulated feature will extend into an area 66 where the actual printed feature 60 does not extend. Therefore despite being accurate in some areas, the photolithographic model does not accurately predict the photolithographic printing process.

Figure 2:
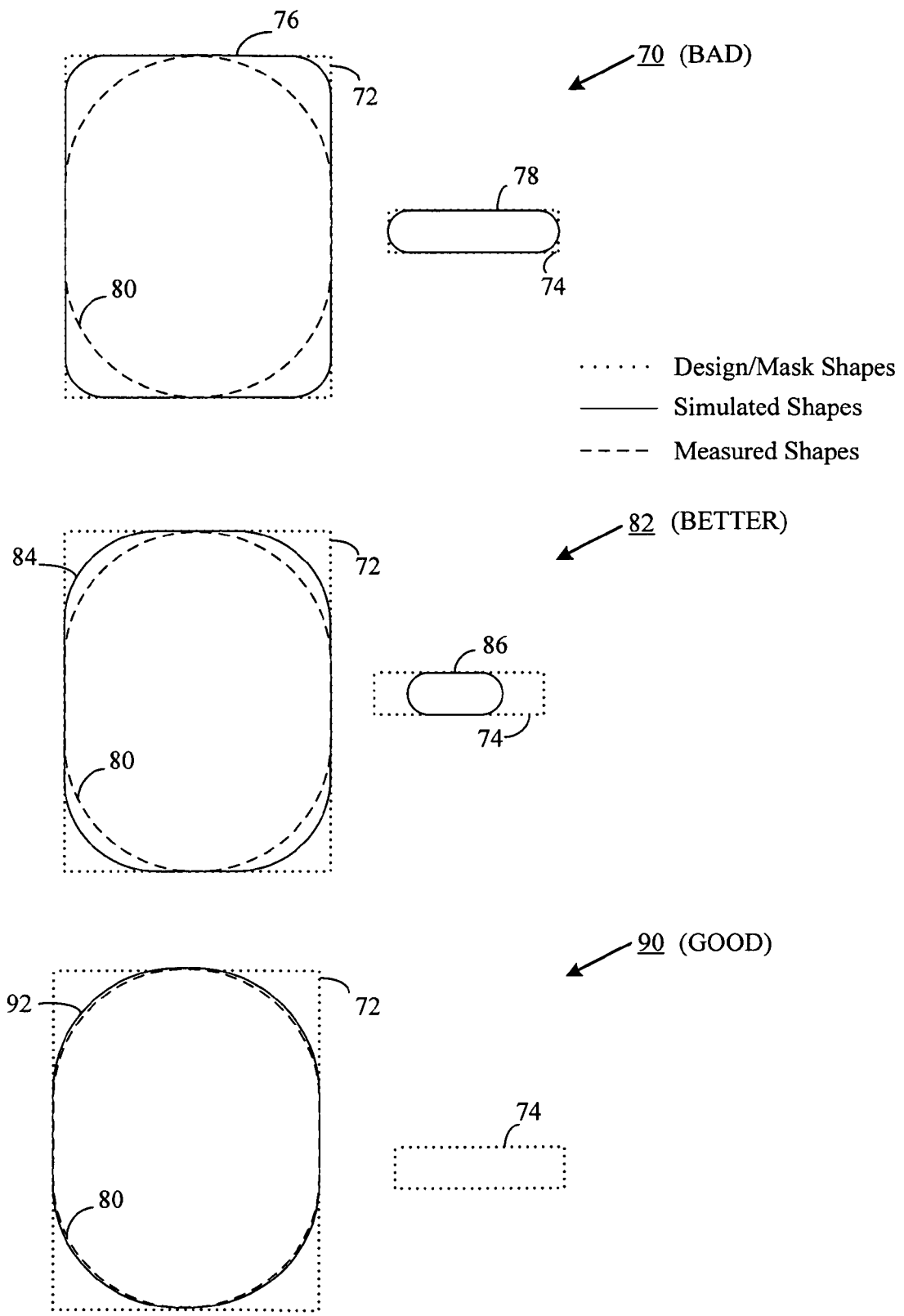
FIG. 2 illustrates a shape-based model metric system in accordance with one embodiment of the disclosed technology.

To determine if a model accurately simulates a photolithographic printing process, one aspect of the disclosed technology is a shape-based model, metric or quantifier that compares the shapes of the printed features with those of the simulated features. FIG. 2 illustrates the results of three photolithographic models, each having different abilities to simulate a photolithographic printing process. A first model 70 predicts how a pair of rectangular target features 72, 74 will print on a wafer. The first model 70 produces a simulated feature 76 having an oval shape that predicts to how the target feature 72 will print on a wafer and a simulated feature 78 that predicts how the target feature 74 will print on a wafer. A printed feature 80 corresponds to how the target feature 72 actually prints on the wafer. The shape of the printed feature 80 is compared to the shape of the simulated feature 76 to gauge how well the model predicts the printing process. As can be seen, shape of the simulated feature 76 is quite different than the shape of the printed feature 80. In addition, the model 70 produces a simulated feature 78 where no corresponding printed feature is formed on the wafer. Therefore, the model 70 is not well calibrated to the actual printing process.

A better model 82 produces a simulated feature 84 that predicts how the target feature 72 will print on a wafer and a simulated feature 86 that represents how the target feature 74 will print on the wafer. The shape of the simulated feature 84 is closer to the shape of the printed feature 80 and the size of the simulated feature 86 is smaller than the simulated feature 78 produced by the model 70. Therefore the model 82 is better than the model 70 but is still not very accurate.

A good model 90 produces a simulated feature 92 that predicts how the target feature 72 will print on a wafer. The shape of the simulated feature 92 is very close to that of the printed feature 80. In addition, the model 90 accurately predicts that no feature will print on the wafer in an area corresponding to the target feature 74. Therefore the model 90 is accurately calibrated to the actual photolithographic printing process.

Figure 3:
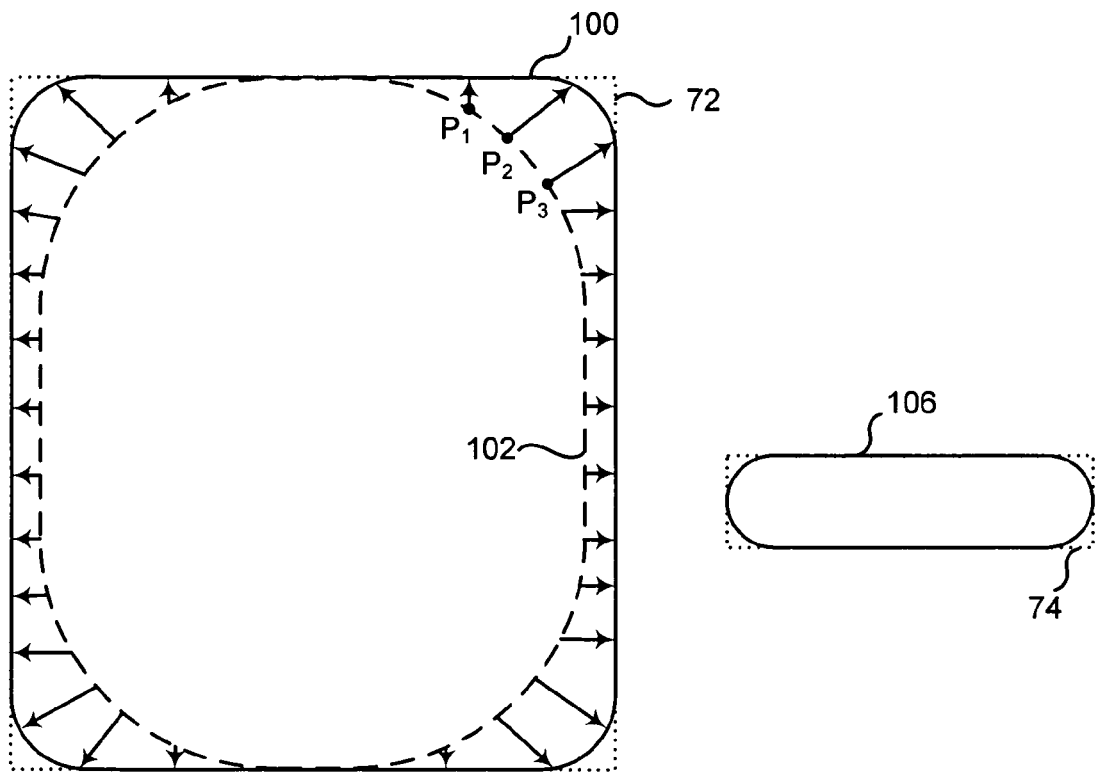
FIG. 3 illustrates a potential error caused by only comparing the shape of a printed feature with the shape of a closest simulated feature.

To determine how well a model predicts a photolithographic process, one embodiment of the disclosed technology compares the shapes of simulated features with the shapes of actual printed features. FIG. 3 illustrates one technique for comparing the shapes of simulated features and printed features. As indicated above, a target pattern of features includes a rectangular feature 72 and a smaller rectangular feature 74 to be printed on a wafer. To determine if the model is accurately calibrated, a test pattern of features is printed on a wafer and the coordinates of a number of points P1, P2, P3 etc on the boundaries of a printed feature 102 are determined. The shape of the printed feature 102 is compared with the shape of a simulated feature 100 that is produced by the model in question. In one embodiment, the closest distance between the points P1, P2, P3 etc. of the printed feature 102 and the boundaries of the simulated feature 100 is used as an indication of how well the model predicts the actual photolithographic printing process. The closer the distances are, the better the photolithographic model predicts the actual photolithographic process.

If the measurements are only made of the distances between the points of the printed feature 102 and the closest simulated feature 100, it is possible that the calibration estimate will miss the fact that the model produces a simulated feature 106 where no printed feature is created on the wafer. Therefore the model will appear better calibrated than it actual is.

Figure 4:
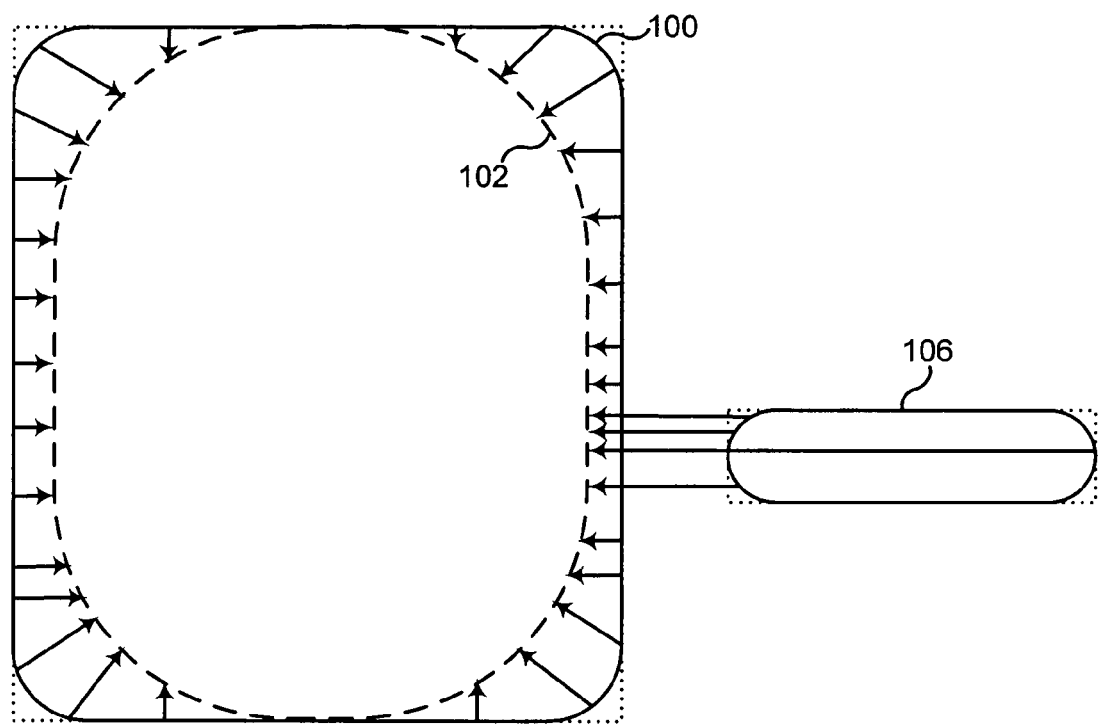
FIG. 4 illustrates an improvement produced by comparing shapes of the all the simulated features with the shapes of all the printed features.

In order to ensure such simulated features are considered, one embodiment of the disclosed technique also measures the distances between all the simulated features and the closest printed features. As shown in FIG. 4, measurements are made from the simulated feature 100 to the closest point on the printed feature 102 as well as from the simulated feature 106 to the closest points on the printed feature 102. Both sets of distance are used in a mathematical formula to gauge the ability of the model to simulate the photolithographic process. Because the distances between the simulated feature 106 and the actual printed feature 102 are relatively large, the mathematical formula indicates that the model does not accurately predict the printing process.

Figure 5:
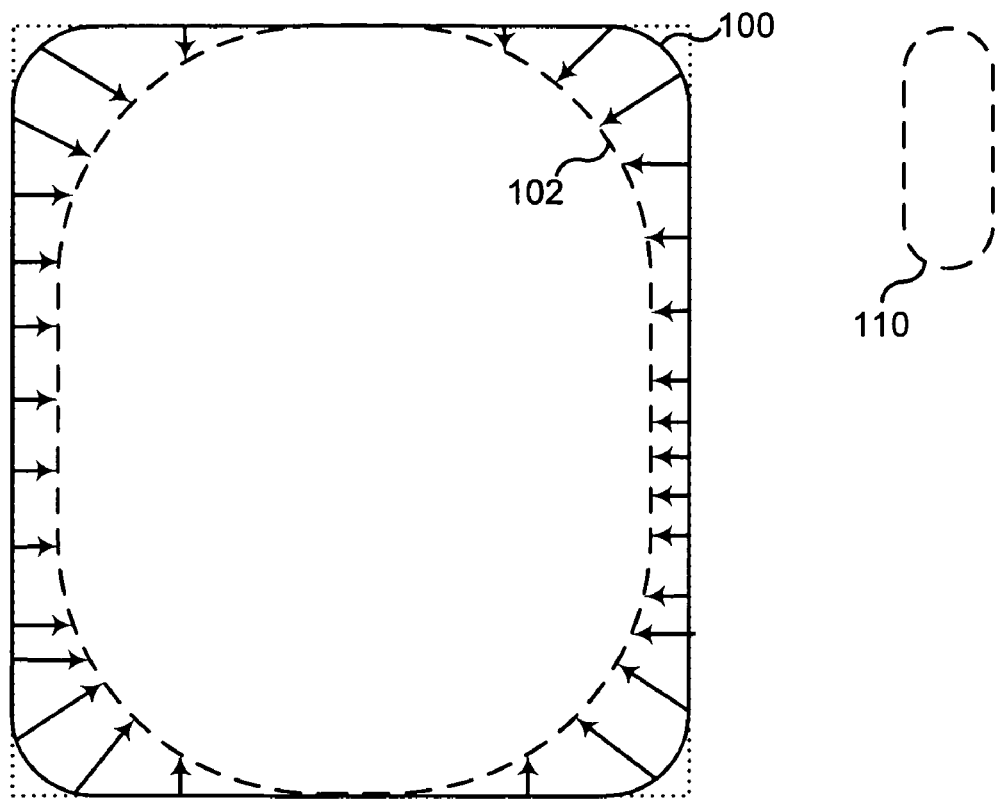
FIG. 5 illustrates a potential error caused by only comparing the shape of a simulated feature with the shape of a closest printed feature.
Figure 6:
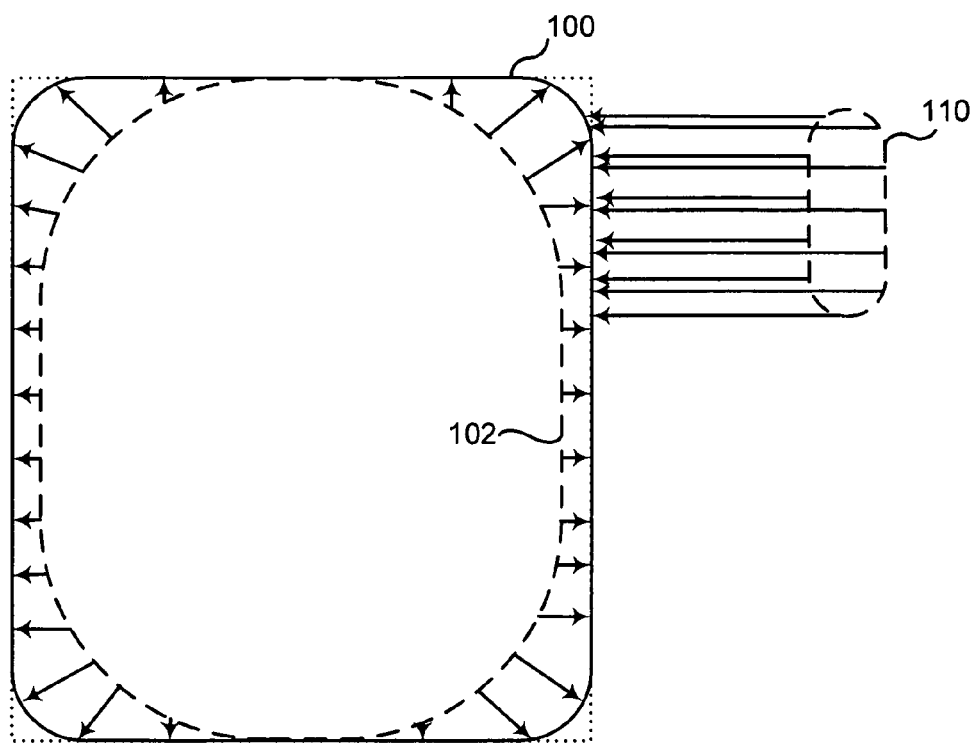
FIG. 6 illustrates an improvement produced by comparing shapes of the all the printed features with the shapes of the simulated features.

FIG. 5 illustrates a similar problem that can occur if measurements are only made of the shortest distance between a simulated feature and a printed feature. In the example shown, measurements are made of the closest distance between the simulated feature 100 and points on the printed feature 102. If measurements are only made between the simulated feature 100 and the printed feature 102, a printed feature 110 that actually prints on the wafer but is not predicted by the model will be missed thereby producing an indication that the model is better than it actually is. For example, feature 110 may print on the wafer if a sub-resolution assist feature is made slightly too large. To account for additional printed features that print on a wafer but are not predicted by the model, one technique of the present disclosed technology measures the distances between the simulated feature 100 and the closest points on the printed feature 102 as shown in FIG. 5 and the shortest distances between the printed features 102, 110 and the simulated feature 100 as shown in FIG. 6.

Figure 7:
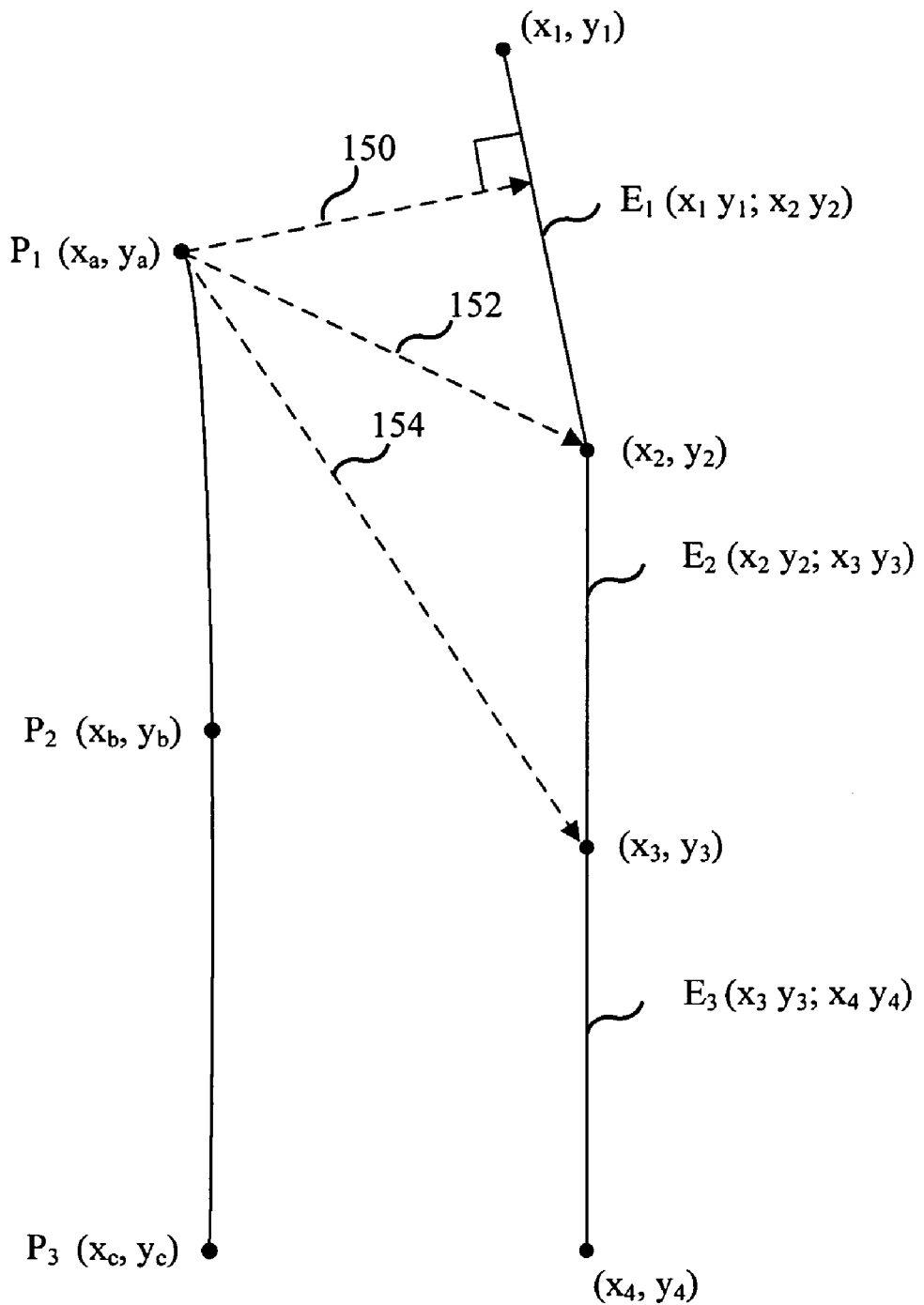
FIG. 7 illustrates one technique for determining a distance between points on a printed feature and edge segments of a simulated feature.

FIG. 7 illustrates one technique for comparing the shape of the printed feature and the shape of a simulated feature. With this technique, a measurement is made of the distance between a series of points P1, P2, P3 etc. around the contour of each printed feature to the nearest point on the simulated feature. In one embodiment the coordinates of the set of measured points P are made by measuring the results of a test pattern print with a scanning electron microscope and are stored in a computer file in a manner that correlates the position of the printed features with the target pattern of features to be printed. In one embodiment, the model produces a set of edge segments E1, E2, E3 etc. that extend around the contours of the simulated shapes.

In one embodiment, the distances between each point on the printed feature and the edge segments of the simulated shapes are calculated by determining if a point P is within the boundaries of an edge segment E. What is considered "within" may depend on the application but may be defined as a point whose perpendicular projection onto an edge falls between the coordinates of the endpoints of the edge segment. If a point on a printed feature is within an edge segment of a simulated feature, then the distance is determined as the shortest distance between the coordinates of the point P and a line that defines the edge segment E. In the example shown in FIG. 7, a line that extends 150 from Point P1 to the edge segment E1 and perpendicular thereto is within the coordinates the edge segment where the line 150 crosses the edge segment E1. Therefore the shortest distance is defined as the length of the line 150.

If a point P on a printed feature is outside of an edge segment on a simulated feature, then the distance is calculated as the distance to the closest coordinate of the edge segment. In the example shown a line from point P1 that is perpendicular to the edge segment E2 would be outside the endpoints of the edge segment E2. Therefore, the distance between the point P1 and the edge segment E2 is calculated as the Euclidean distance between point (xa, ya) and the point (x2, y2) as indicated by the line 152. Similarly, the distance between the point P1 and the edge segment E3 is the Euclidean distance between the point (xa,ya) and the point (x3,y3) as indicated by the line 154 etc.

In one embodiment, the distances between each point P on the printed features and each edge segment E in a region of interest are determined. The region of interest may include an entire field of view of a scanning electron microscope or may be smaller than the field of view or larger than the field of view by combining measurements from several fields of view. It is appreciable that, within the region of interest, one can establish sub-regions where different weights are assigned the various measurements obtained between the printed features and the simulated features or vice versa. For example, one may assign more weight to measurements associated with features or portions of features that are highly curved or are critical to the operation of the integrated circuit. Such areas can be identified by hand, by a computer analyzing the outline of the features or by analyzing the features by a rule (i.e. all gate features are weighted more) etc. Similarly measurements for those features that are less important to the operation of the integrated circuit can be weighted less, such as measurements for dummy features, fill patterns alignment marks, long metal lines etc.

Alternatively, the area for adjusting the weights can be a physical area that includes many features such as a portion of the field of view of a scanning electronic microscope. By adjusting the weights, any differences between a printed feature and a simulated feature can be emphasized (or deemphasized if necessary) so that the accuracy of the model to predict how the features will print in desired or critical areas can be quantified.

In one embodiment of the disclosed technology, the measure of how well a model predicts a photolithographic printing process is determined calculating a cost function for the model. In one embodiment, the cost function is calculated as a mathematical function of the distances determined. For example, the mathematical function may be calculated by adding the sum of the shortest distances from each point on the printed features to a closest edge segment of a simulated feature plus the sum of the shortest distances from the edge segments to the points on the measured features and dividing the result by two. However it will be appreciated that other cost functions could be used. For example, if distances determined can have negative values as well as positive values and can have also an adjustable weight, then it may be desirable to calculate square root of the sum of the weights times distances squared, divided by the sum of the weights and finally divide the result by two.

By comparing the cost function calculated for different photolithographic models, the different models can be compared. For example, if the cost function is high, then the model does not accurately simulate the photolithographic process and the model may need to be improved or adjusted. On the other hand, a model with a low cost function likely does a good job of simulating the photolithographic printing process.

Figure 8:
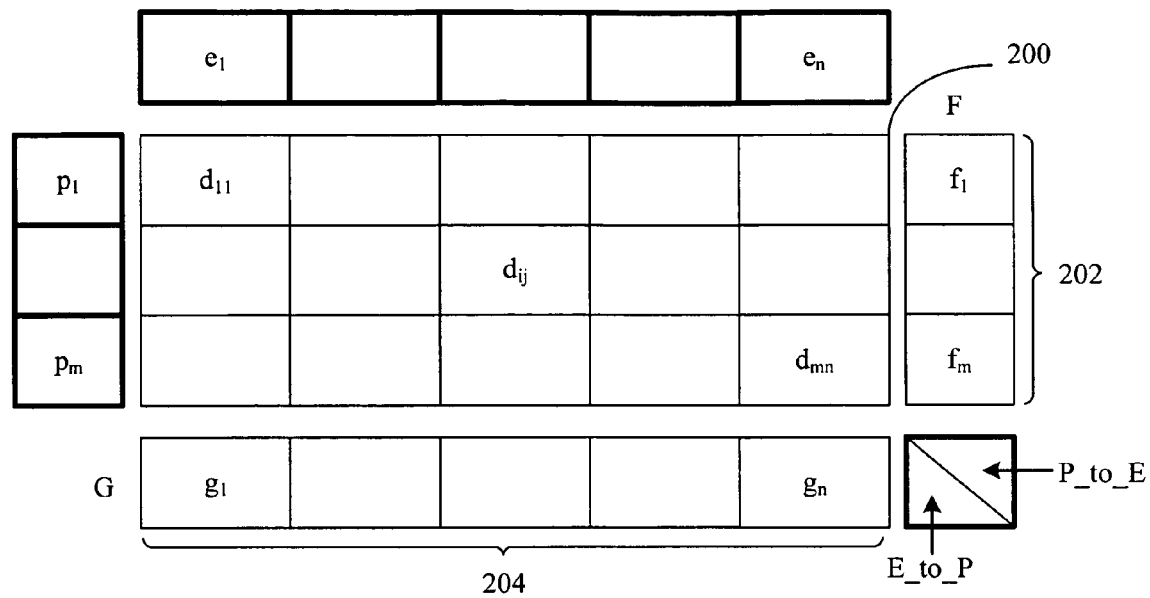
FIG. 8 illustrates one technique for producing an indication of model calibration.
Figure 9:
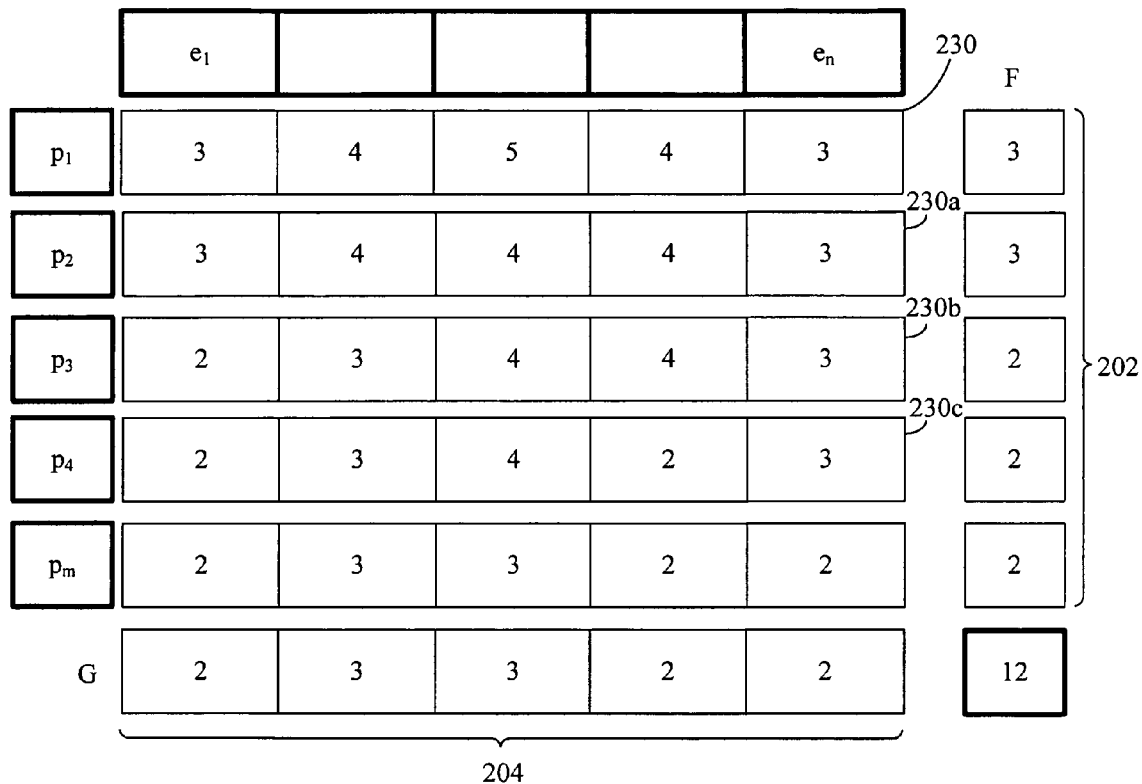
FIG. 9 illustrates another technique for producing an indication of model calibration.

FIGS. 8 and 9 illustrate two techniques for calculating the cost function of a model from the comparison of the shapes of the printed and simulated features. In the example shown in FIG. 8, a matrix 200 is defined having a number of rows equal to the number of measured points on the printed features and a number of columns equal to the number of edge segments of the simulated features in the region of interest. Each entry in the matrix 200 stores the distance between the corresponding point on the printed feature and a corresponding edge segment on the simulated feature. A vector (F) 202 stores the minimum distance between each point P on a printed feature and a closest edge segment E of a simulated feature (the P_to_E distances). A vector (G) 204 stores the closest distance between each edge segment E in the simulated features and a point P on a printed features (the E_to_P distances).

In one embodiment, the cost function for the photolithographic model is determined by adding each value of the entries in the vector F plus the value of the entries in the vector G and dividing the result by two.

Because the region of interest that contains the printed features may contain thousands of measured points and the simulated features may contain thousands of edge segments, the matrix 200 requires substantial amounts of computer memory to store. Therefore, an alternative technique as shown in FIG. 9 can be used to compute the cost function. In this technique, not all calculated distances between a point and an edge segments are stored. Only the shortest distance between a point and an edge segment is stored. A temporary array 230 is defined as having length equal to a number of edge segments in the simulated features. The arrays 230a, 230b, 230c, etc. in FIG. 9 represent the steps as calculation progresses.

To compute the cost function, the distances between the each point, for example point P1, and each edge segment E in the simulated features are determined. Once the distances between each point P and the edge segments are determined, the shortest distance between the point and an edge segment is stored in an entry in the vector F 202 as described above. The distance from the point P to the various edge segments are also stored in the vector G 204. The distances between the next point P2 of a printed feature and the edge segments of the simulated features are then determined and the next entry in the vector F 202 is selected and so forth. The distance between an edge segment on a simulated feature and a point P on a printed feature is the same as the distance from the point P on the printed feature to the edge segment on the simulated feature. Therefore, upon calculation of the distances from each point, the distance between any given point and an edge segment is analyzed to determine whether it is less than a previously determined distance between another point on a printed feature and the same edge segment. If the distance is less, the smallest distance is stored replacing the larger distance in the corresponding column of the array 230. Once all the distances between the points on the printed features and the edge segments of the simulated features are calculated, the values in the vector G 204 can be determined by copying the values in the array 230. Finally, the cost function is calculated.

Although the disclosed embodiments calculate the distances from the points on the printed features to the edge segments of the simulated features, it will be appreciated that the matrix could be completed by first computing the distances from the edge segments to the points on the printed features.

Figure 10A:
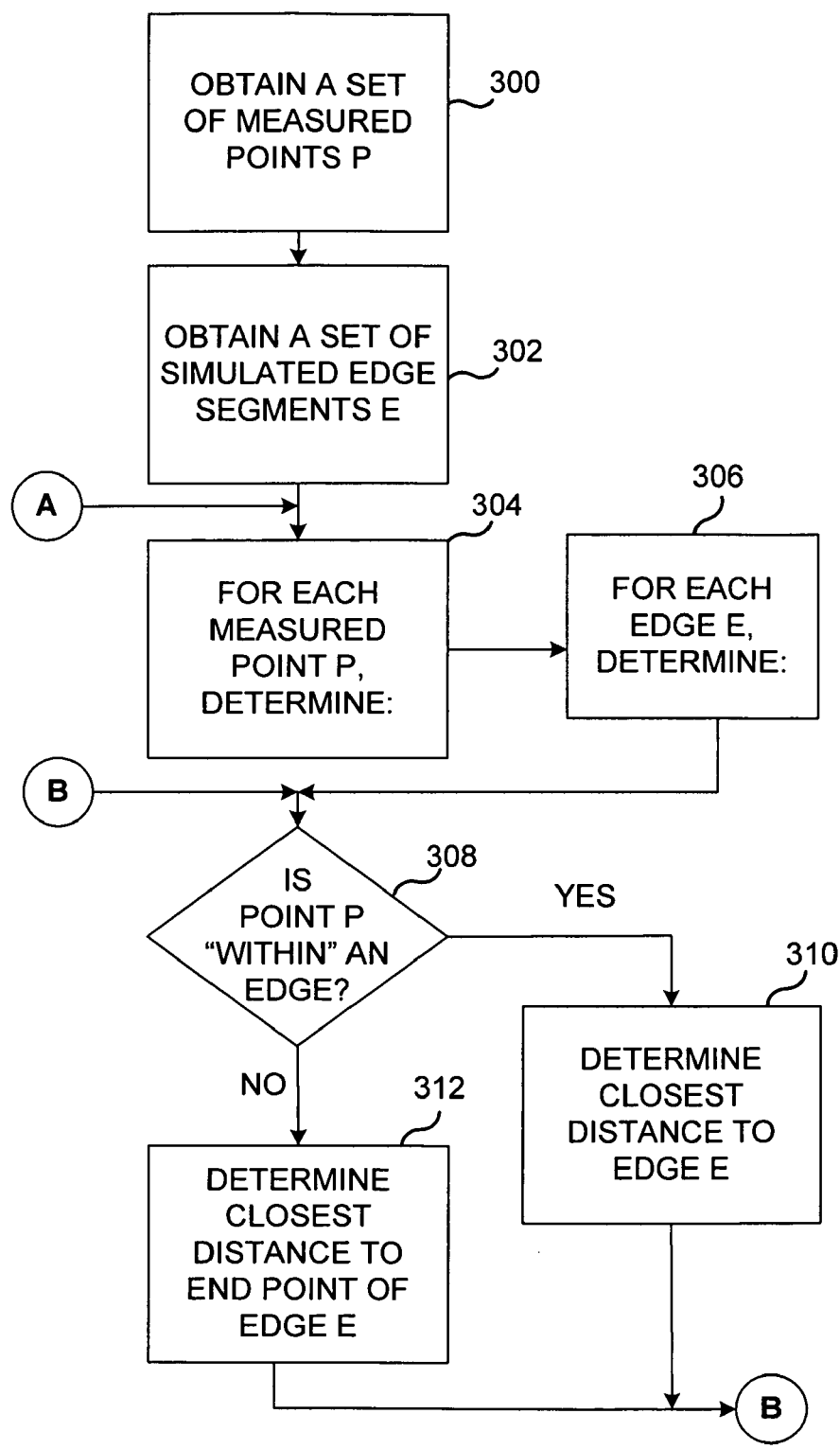
FIGS. 10A-10C are flow charts of acts performed in accordance with one disclosed technique for producing an indication of model calibration.
Figure 10B:
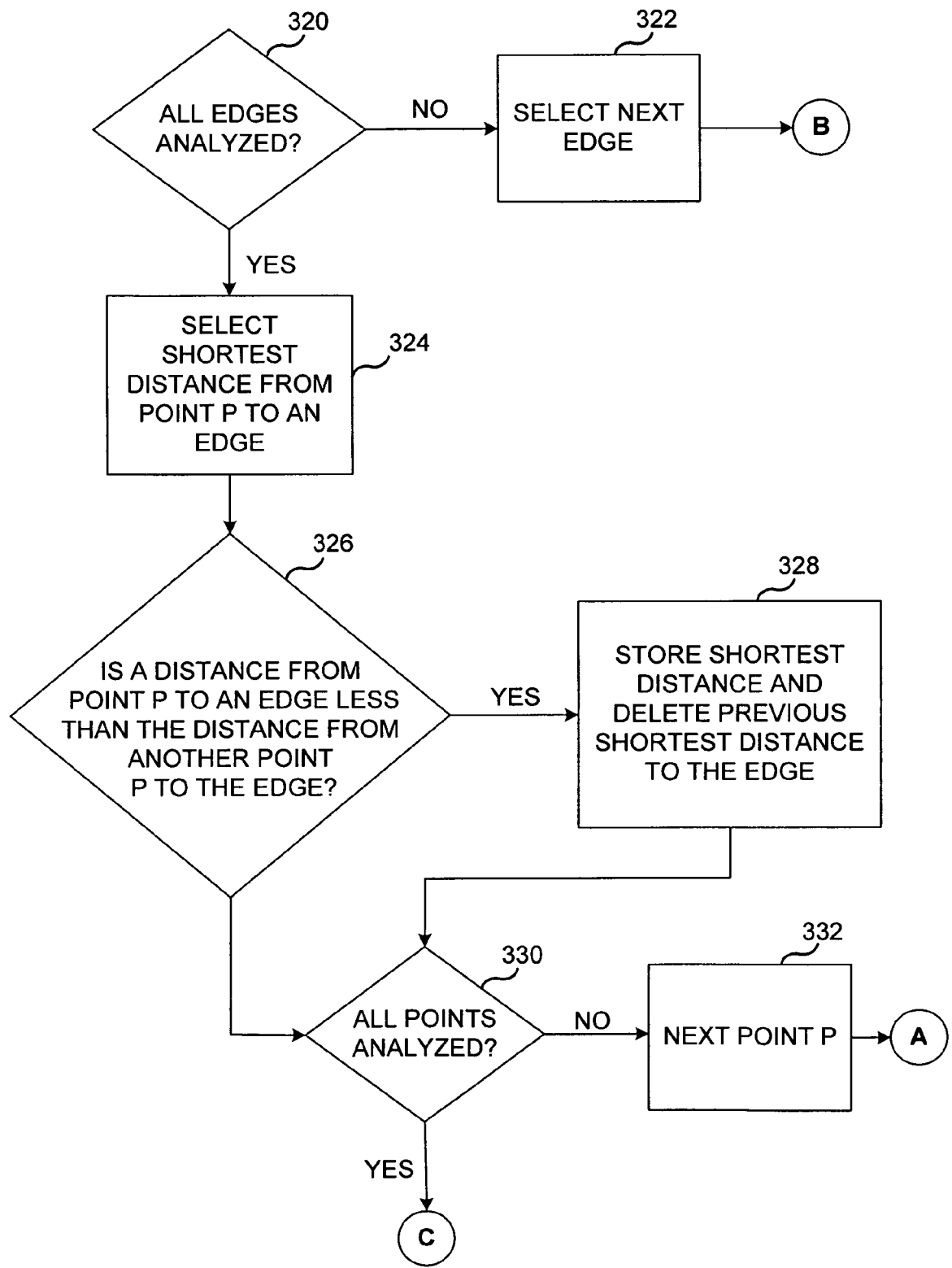
Figure 10C:
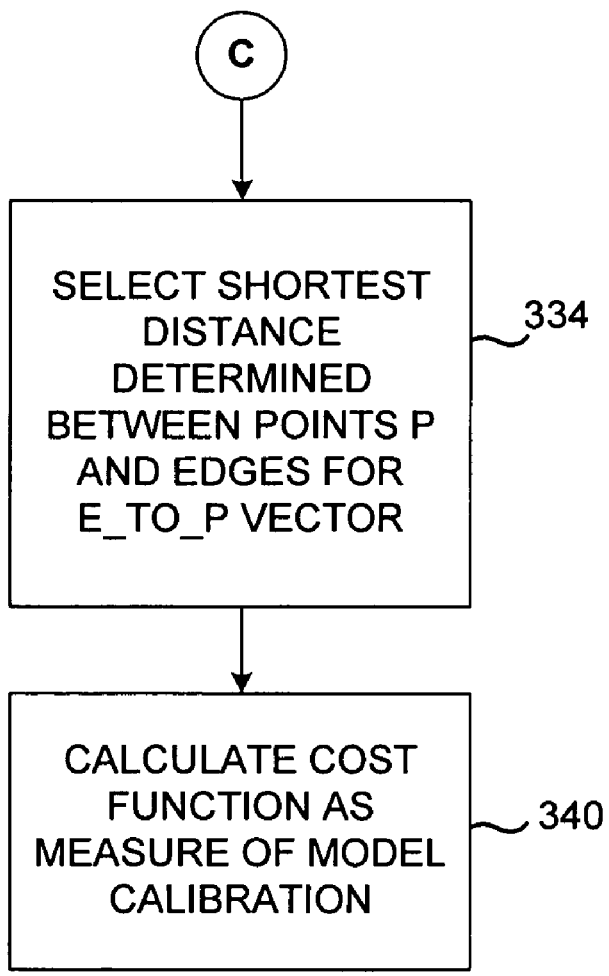

FIGS. 10A-10C illustrate a series of acts performed in accordance with one embodiment of the disclosed technology to compute an indication of how well photolithographic model predicts the printing of features on a wafer. Beginning at 300, a set of measured points, P, on a set of printed features within a region of interest is determined. At 302, a set of edge segments of simulated features within the region of interest is determined from a photolithographic model in question. At 304 and 306 a nested loop analyzes each point P on the printed features with each edge segment E on the simulated features. At 308, is determined if a point P is within an edge segment. If the answer to 308 is yes, then the closest distance between the point P and a line that extends between the end points of the edge segment is determined. If the answer to 308 is no, then the distance between the point P and the edge segment is determined to be the distance between the point P and the closest end point of the edge segment.

At 320, it is determined if all edge segments have been analyzed. If the answer is no, the next edge segment is selected at 322 and the process returns to step 308. If the answer at this 320 is yes, then the shortest distance from point P to an edge segment is selected as entry for the vector F 202 at 324 as shown in FIGS. 8 and 9. At 326, it is determined if the distance from a point P to an edge segment is less than a previously determined distance from a point on a printed feature to the edge segment. If so, the newly calculated shortest distance is stored in the array and the previously calculated shortest distance is deleted from the array at 328.

At 330, it is determined if all points on the printed features have been analyzed. If not, processing proceeds to the next point at 332 in the process returns to step 304 as shown in FIG. 10A.

If all points on the printed features have been analyzed, the shortest distances determined between the each edge segment and points of the printed features are selected for the vector G 204 as shown in FIGS. 8 and 9. Once the vectors F and G have been calculated, the cost function for the photolithographic model is calculated at 340.

From the cost function calculated, the ability of the model to accurately simulate the photolithographic printing process can be compared to other models or to the same model assuming different operating conditions.

Figure 11:
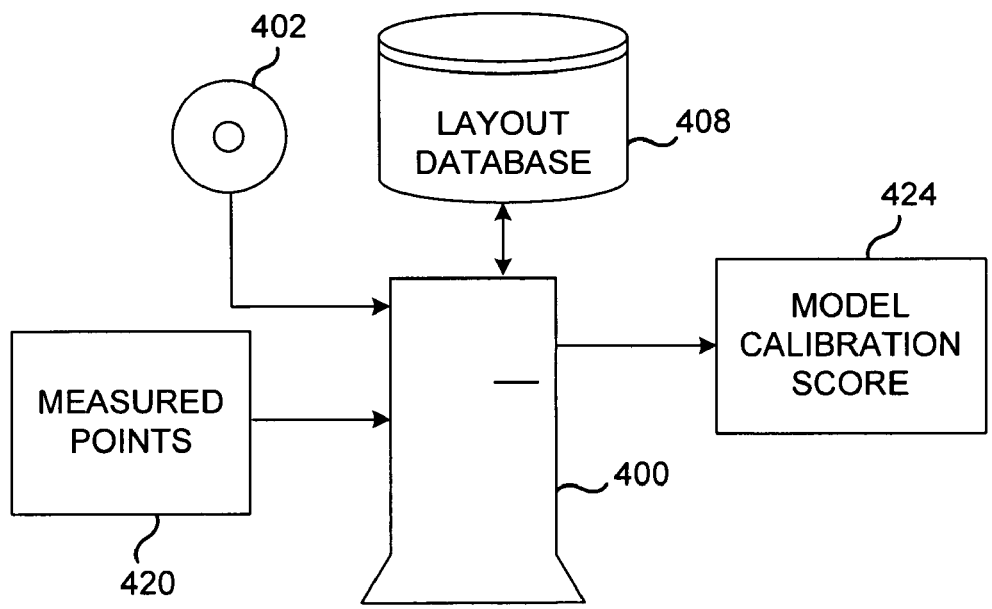
FIG. 11 illustrates a representative computer system that can be used to produce an indication of model calibration in accordance with the described techniques.

FIG. 11 illustrates a representative computer system that can perform the shape base layout calibration system as described above. A computer system 400 receives a set of executable instructions on a computer readable medium such as a CD-ROM, DVD, hard drive, flash memory, wired or wireless communication link etc. A desired layout file is stored in a layout a database 408, which is typically stored in a standard layout database format such as GDS-II or OASIS. The computer system 400 uses the layout database in connection with the photolithographic model to produce the simulated features. The shapes of the simulated features are compared with a set of measured points 420 that define the shapes of the printed features. The computer system 400 produces an estimate of how the photolithographic model simulates the printing of features upon a wafer. Given estimate scores for different models, the best model can be selected or the models can either be adjusted or re-calibrated to the actual results printed on a wafer.

In view of the principles of the disclosed invention may be applied, it should be recognized that the illustrated embodiments are only preferred examples of the invention and should not be taken as limiting the scope of the invention. Rather, the scope of the invention is defined by the following claims and equivalents thereof.

We claim:

1. A method of quantifying how well a photolithographic model simulates a photolithographic printing process, comprising:
   receiving a number of simulated features produced by a model that simulates how a test pattern will print on a wafer with a photolithographic process, the simulated features comprising one or more edge segments;
   receiving a description of the shapes of printed features on a wafer printed using the test pattern; and
   using a computer, comparing the shapes of the simulated features with the shapes of the printed features by calculating one or more distances between at least one point on one of the printed features and at least one of the edge segments to quantify how the photolithographic model simulates the photolithographic printing process.

2. The method of claim 1, wherein description of the shapes of the printed features is received by: receiving coordinate points on the contours of the printed features.

3. The method of claim 1, wherein the calculating one or more distances comprises calculating a distance between the at least one point on the one of the printed features and a closest simulated feature.

4. The method of claim 1, wherein the comparing the shapes further comprises calculating a shortest distance between each point on the one of the printed features and a closest edge segment of a simulated feature and the shortest distance between each of the at least one of the edge segments and a point on the one of the printed features.

5. The method of claim 4, wherein the shape of the one of the printed features and the shape of one of the simulated features are compared by adding the shortest distances determined.

6. The method of claim 1, wherein the distances between each point on the one of the printed feature and each of the respective edge segments are calculated in a field of view of a scanning electron microscope.

7. The method of claim 1, wherein the shapes of the simulated features and the shapes of the printed features are within a region of interest.

8. The method of claim 1, wherein a variable weight is assigned to the calculated distances between printed features and simulated features.

9. The method of claim 8, wherein the simulated features or printed features define a portion of an integrated circuit, and a variable weight, which is assigned to the calculated distances in areas of features that are designated as more important to the operation of the integrated circuit, is increased.

10. The method of claim 8, wherein the simulated features or printed features define a portion of an integrated circuit, and a variable weight, which is assigned to the calculated distances in areas of features that are designated as less important to the operation of the integrated circuit, is decreased.

11. The method of claim 1, further comprising fabricating a mask or reticle using a simulation model selected, adjusted, or re-calibrated based on the comparing.

12. The method of claim 1, further comprising storing a simulation model selected, adjusted, or re-calibrated based on the comparing in a computer-readable storage device.

13. The method of claim 1, further comprising fabricating an integrated circuit using a simulation model selected, adjusted, or re-calibrated based on the comparing.

14. A method of quantifying how a photolithographic model simulates a photolithographic printing process, comprising:
    receiving a description of a number of simulated features produced by a photolithographic model that indicate how a test pattern will print with a photolithographic process, wherein the number of simulated features is defined by edge segments that extend around the perimeter of the simulated features;
    receiving locations of a number of points of the perimeter of features that are printed on a wafer with the test pattern;
    storing a shortest distance calculated between each point on the printed features and an edge segment of the simulated features and the shortest distance between each of the edge segments and a point on the printed features; and
    using a computer, quantifying how the photolithographic model simulates the photolithographic printing process from the shortest distances stored.

15. The method of claim 14, further comprising:
    a) determining distances between a first point on a printed feature and the edge segments of the simulated features;
    b) from the distances determined in a), selecting a shortest point to edge segment distance;
    c) determining distances between another point on a printed feature and the edge segments of the simulated features;
    d) from the distances determined in b), selecting another shortest point to edge segment distance;
    e) from the distances determined in a) and b) selecting and storing the shortest distance from an edge segment to the first point or the other point;
    f) repeating acts c) and d) for each point on the printed features and determining if a distance from each edge segment to a point on a printed feature is less than the stored shortest distance from the edge segment to a point on a printed feature and if so, selecting and storing the shortest distance determined from the edge segment to a point on a printed feature; and
    g) determining the ability of the model to simulate the photolithographic process from the shortest distances determined.

16. The method of claim 14, wherein the distances between each point on the printed features and each edge segment of the simulated features is determined within a region of interest.

17. The method of claim 14, further comprising fabricating a mask or reticle using a simulation model selected, adjusted, or re-calibrated based on the quantifying.

18. The method of claim 14, further comprising storing a simulation model selected, adjusted, or re-calibrated based on the quantifying in a computer-readable storage device.

19. The method of claim 14, further comprising fabricating an integrated circuit using a simulation model selected, adjusted, or re-calibrated based on the quantifying.

20. A computer-readable storage device storing a sequence of programmed instructions that are executable by a computer to perform a method, the method comprising:
    receiving a number of simulated features produced by a model that simulates how a test pattern will print on a wafer with a photolithographic process, the simulated features comprising one or more edge segments;
    receiving a description of the shapes of printed features on a wafer printed using the test pattern; and
    comparing the shapes of the simulated features with the shapes of the printed features by calculating one or more distances between at least one point on one of the printed features and at least one of the edge segments to quantify how the photolithographic model simulates the photolithographic printing process.

21. The computer-readable storage device of claim 20, wherein description of the shapes of the printed features is received by: receiving coordinate points on the contours of the printed features.

22. The computer-readable storage device of claim 20, wherein the calculating one or more distances comprises calculating a distance between the at least one point on the one of the printed features and a closest simulated feature.

23. The computer-readable storage device of claim 20, wherein the comparing the shapes further comprises calculating a shortest distance between each point on the one of the printed features and a closest edge segment of a simulated feature and the shortest distance between each of the at least one of the edge segments and a point on the one of the printed features.

24. The computer-readable storage device of claim 23, wherein the shape of the one of the printed features and the shape of one of the simulated features are compared by adding the shortest distances determined.

25. The computer-readable storage device of claim 20, wherein the distances between each point on the one of the printed feature and each of the respective edge segments are calculated in a field of view of a scanning electron microscope.

26. The computer-readable storage device of claim 20, wherein the shapes of the simulated features and the shapes of the printed features are within a region of interest.

27. The computer-readable storage device of claim 20, wherein a variable weight is assigned to the calculated distances between printed features and simulated features.

28. The computer-readable storage device of claim 27, wherein the simulated features or printed features define a portion of an integrated circuit, and a variable weight, which is assigned to the calculated distances in areas of features that are designated as more important to the operation of the integrated circuit, is increased.

29. The computer-readable storage device of claim 27, wherein the simulated features or printed features define a portion of an integrated circuit, and a variable weight, which is assigned to the calculated distances in areas of features that are designated as less important to the operation of the integrated circuit, is decreased.

30. The computer-readable storage device of claim 20, wherein the computer-readable storage device is a CD-ROM, DVD, hard drive, or flash memory.

31. A computer-readable storage device storing a sequence of programmed instructions that are executable by a computer to perform a method, the method comprising:

receiving a description of a number of simulated features produced by a photolithographic model that indicate how a test pattern will print with a photolithographic process, wherein the number of simulated features is defined by edge segments that extend around the perimeter of the simulated features;

receiving locations of a number of points of the perimeter of features that are printed on a wafer with the test pattern;

storing a shortest distance calculated between each point on the printed features and an edge segment of the simulated features and the shortest distance between each of the edge segments and a point on the printed features; and quantifying how the photolithographic model simulates the photolithographic printing process from the shortest distances stored.

32. The computer-readable storage device of claim 31, wherein the method further comprises:

a) determining distances between a first point on a printed feature and the edge segments of the simulated features;

b) from the distances determined in a), selecting a shortest point to edge segment distance;

c) determining distances between another point on a printed feature and the edge segments of the simulated features;

d) from the distances determined in b), selecting another shortest point to edge segment distance;

e) from the distances determined in a) and b) selecting and storing the shortest distance from an edge segment to the first point or the other point;

f) repeating acts c) and d) for each point on the printed features and determining if a distance from each edge segment to a point on a printed feature is less than the stored shortest distance from the edge segment to a point on a printed feature and if so, selecting and storing the shortest distance determined from the edge segment to a point on a printed feature; and g) determining the ability of the model to simulate the photolithographic process from the shortest distances determined.

33. The computer-readable storage device of claim 31, wherein the distances between each point on the printed features and each edge segment of the simulated features is determined within a region of interest.

34. The computer-readable storage device of claim 31, wherein the computer-readable storage device is a CD-ROM, DVD, hard drive, or flash memory.

* * * * *